United States Patent
Donofrio

(10) Patent No.: US 10,083,885 B1
(45) Date of Patent: Sep. 25, 2018

(54) MULTI-LAYER POTTING FOR ELECTRONIC MODULES

(71) Applicant: Cree, Inc., Durham, NC (US)

(72) Inventor: Matthew Donofrio, Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 15/614,924

(22) Filed: Jun. 6, 2017

(51) Int. Cl.
| | |
|---|---|
| *H01L 23/053* | (2006.01) |
| *F21V 29/507* | (2015.01) |
| *F21V 21/30* | (2006.01) |
| *H01L 23/24* | (2006.01) |
| *H01L 23/043* | (2006.01) |
| *F21V 19/00* | (2006.01) |
| *H01L 23/00* | (2006.01) |
| *F21V 29/70* | (2015.01) |

(52) U.S. Cl.
CPC .......... *H01L 23/053* (2013.01); *F21V 19/003* (2013.01); *F21V 21/30* (2013.01); *F21V 29/507* (2015.01); *F21V 29/70* (2015.01); *H01L 23/043* (2013.01); *H01L 23/24* (2013.01); *H01L 24/49* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 6,597,113 B1* | 7/2003 | Nitta | ....................... | H01J 11/12 313/581 |
| 6,614,108 B1* | 9/2003 | Sanftleben | .............. | H01L 23/10 257/678 |
| 7,145,253 B1* | 12/2006 | Kim | .................... | B81C 1/00333 257/790 |
| 9,723,680 B2* | 8/2017 | Pope | .................... | H05B 33/086 |
| 2003/0075355 A1* | 4/2003 | Anderson | .............. | G02B 6/266 174/254 |
| 2006/0013542 A1* | 1/2006 | Schunk | ................ | G02B 6/4201 385/92 |
| 2009/0086491 A1* | 4/2009 | Ruud | ...................... | F21S 8/086 362/294 |

(Continued)

OTHER PUBLICATIONS

Azo Materials., Silicone Rubber, Granata Design. https://www.azom.com/properties.aspx?ArticleID=920.*

(Continued)

*Primary Examiner* — Dimary Lopez Cruz
*Assistant Examiner* — Muhammed Azam
(74) *Attorney, Agent, or Firm* — Withrow & Terranova, P.L.L.C.

(57) ABSTRACT

An electronics module, such as driver modules for LED-based lighting fixtures and the like, includes a printed circuit board (PCB), a stress mitigation layer, and a potting layer. The PCB has a plurality of vias, which extend through the printed circuit board. A plurality of electronic components may each have a body and a plurality of leads extending from the body and through corresponding ones of the plurality of vias, wherein solder joints electrically and mechanically affix the plurality of leads within the corresponding ones of the plurality of vias. The stress mitigation layer is applied over a top surface of the printed circuit board. The potting layer is applied over the stress mitigation layer and the plurality of electronic components.

35 Claims, 14 Drawing Sheets

(56) References Cited

U.S. PATENT DOCUMENTS

| | | | | |
|---|---|---|---|---|
| 2009/0189528 | A1* | 7/2009 | Wang | F21V 29/20 315/51 |
| 2010/0110676 | A1* | 5/2010 | Falicoff | F21V 5/04 362/235 |
| 2010/0218805 | A1* | 9/2010 | Everett | H01L 31/02168 136/246 |
| 2010/0284182 | A1* | 11/2010 | Pan | G02B 6/001 362/235 |
| 2011/0211332 | A1* | 9/2011 | Hilscher | F21V 7/22 362/84 |
| 2011/0211351 | A1* | 9/2011 | Van De Ven | F21V 19/003 362/249.02 |
| 2012/0044687 | A1* | 2/2012 | Lee | F21V 29/004 362/249.02 |
| 2014/0268790 | A1* | 9/2014 | Chobot | F21V 23/0464 362/276 |
| 2015/0198298 | A1* | 7/2015 | Scarlata | F21S 9/00 362/184 |

OTHER PUBLICATIONS

Smooth-On, Durometer Shore Hardness Scale, Smooth-ON. https://www.smooth-on.com/page/durometer-shore-hardness-scale/.*

MatWeb. Overview of materials for Silicone Rubber, MatWeb, http://www.matweb.com/search/datasheetaspx?matguid=cbe7a469897a47eda563816c86a73520&ckck=1.*

ShinEtsu. Thermal conductivity—Characteristic properties of Silicone Rubber Compounds, ShinEtsu. https://www.shinetsusilicone-global.com/catalog/pdf/rubber_e.pdf.*

Author Unkown, "Miliatry Specification: Coating, Polyurethan, Single Component System," MIL-C-47002 (MI), Superseding MIS-14124, Apr. 19, 1974, U.S. Army Missile Command, 9 pages.

Author Unknown, "Military Specification: Compound, Molding, Transfer, Epoxy Resin, Single-Component," MIL-C-47224A (MI), Superseding MIL-C-47224 (MI), Feb. 20, 1981, U.S. Army Missile Command, 10 pages.

Author Unknown, "Military Specification: Insulating Compound, Electrical, Embedding, Epoxy," MIL-I-16923H, Superseding MIL-I-16923G, Aug. 13, 1991, Defense Quality and Standardization Office, 17 pages.

Author Unknown, "Military Specification: Insulating Compound, Electrical, Epoxy, Colloidal Silica Filled for Potting and Encapsulation," MIL-I-468658 (MI), Superseding MIL-I-46865A (MI), Jun. 28, 1991, U.S. Army Missile Command, 13 pages.

Author Unknown, "Military Specification: Molding and Potting Compound, Chemically Cured, Polyurethane," MIL-M-24041C, Superseding MIL-M-0024041B (SHIPS) and MIL-M-24041A, Aug. 17, 1981, Naval Sea Systems Command: SEA 3112, 23 pages.

Author Unknown, "Military Specification: Polyurethane Foam, Polyether Type, Rigid, for Packaging and Encapsulation of Electronic Components," MIL-P-47099A (MI), Superseding MIL-P-47099 (MI), Mar. 31, 1989, U.S. Army Missile Command, 12 pages.

Author Unkown, "Military Speficiation: Potted Circuit Card Assembly for Tow-2/E6 Probe and S&A Assembly," MIL-P-70661 (AR), Apr. 27, 1987, U.S. Army Armament Munitions and Chemical Command, 28 pages.

Author Unknown, "Military Specification: Process for Potting and Molding of Cable Assemblies," MIL-P-46872 (MI), Superseding MIS-13157, Dec. 14, 1973, 13 pages.

Author Unknown, "Military Specification: Resin, Casting, Fire Retardant, Epoxy Base," MIL-R-47025A (MI), Superseding MIL-R-47025 (MI), Mar. 5, 1991, U.S. Army Missile Command, 10 pages.

Author Unkown, "Military Standardization Handbook: Adhesive Bonding," MIL-HDBK-691B, Superseding MIL-HDBK-691A, Mar. 12, 1987, Army Materials Technology Laboratory, Department of Defense, Washington, D.C., 469 pages.

Author Unknown, "Specification for Compound, Potting and Molding, Elastomeric," John F. Kennedy Space center, NASA, Electrical/Electronic Design Division, KSC-SPEC-E-0029, Apr. 21, 1972, 25 pages.

Horner, April, "Aircraft Materials Fire Test Handbook," Office of Aviation Research, Report No. DOT/FAA/AR-00/12, Final Report, Apr. 2000, www.actlibrary.tc.faa.gov, Washington, D.C., U.S. Department of Transportation, 235 pages.

* cited by examiner

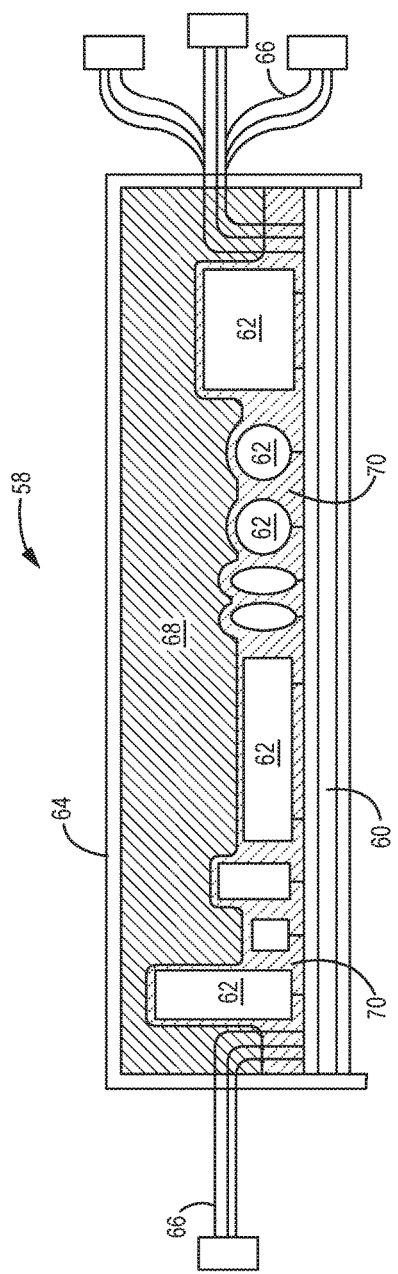
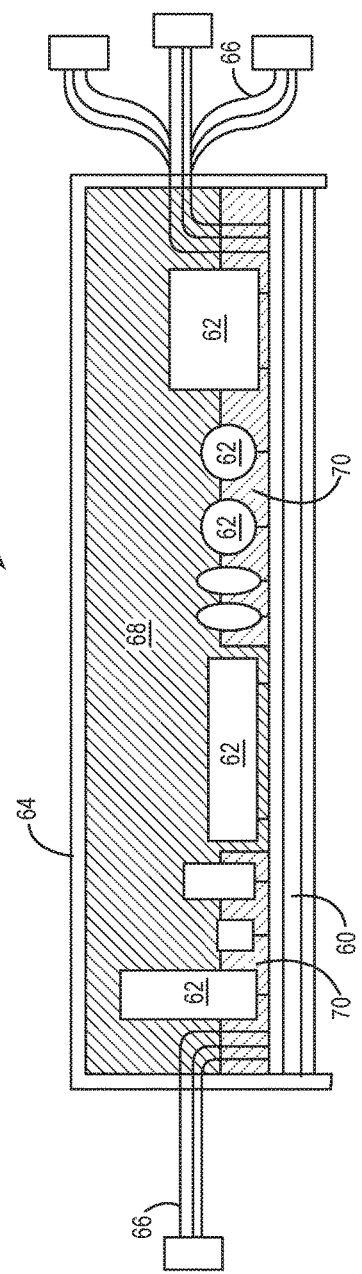
FIG. 8
FIG. 9A

MULTI-LAYER POTTING FOR ELECTRONIC MODULES

FIELD OF THE DISCLOSURE

The present disclosure relates to electronics, and in particular to multilayer potting for electronic modules.

BACKGROUND

In recent years, a movement has gained traction to replace traditional incandescent and fluorescent lighting fixtures with lighting fixtures that employ light emitting diodes (LEDs). Compared with traditional lighting fixtures, LED-based light fixtures are much more efficient at converting electrical energy into light, are potentially much longer lasting, and are also capable of producing light that is both very natural and excellent at rendering colors. As a result, lighting fixtures that employ LED technologies are rapidly replacing incandescent and fluorescent fixtures in residential, commercial, and industrial applications.

Unlike incandescent and fluorescent lighting fixtures, an LED-based lighting fixture requires relatively complex electronics to drive one or more LEDs, and in many instances, multiple strings of LEDs. The electronics generally include power conversion and supply circuitry in addition to special control circuitry to provide uniquely configured signals that are required to drive the one or more LEDs in a desired fashion. While the LEDs themselves are solid-state devices that tend to operate over greatly fluctuating temperatures for long periods of time, the electronics associated with the LEDs are often prone to failure. These failures generally stem from component failures as well as printed circuit board (PCB) failures that are caused by the repeated cycling between relatively low and high temperatures.

Solder joints are a source of the PCB failures. Solder joints are used to electrically and mechanically couple the leads of electronic components to the vias of the PCBs. The PCBs are often mounted in a housing, and the open regions between the PCBs and the housing are filled with a potting material. The potting material helps to dissipate heat generated by the electronic components, as well as protect the electronic components from problematic environmental elements, such as water and conductive debris.

Silicone mixed with thermally conductive fillers has been widely adopted as a potting material for LED-based lighting fixture applications. Since silicone remains relatively soft, silicone has traditionally been considered a low-stress potting material. Unfortunately, while silicone is relatively soft, its relatively high coefficient of thermal expansion (CTE) causes an inordinate number of solder joint failures. Since the potting material is in contact with and generally surrounds the electronic components, the expansion and contraction of the silicone results in significant and repetitive forces being imparted on the electronic components that are mounted to the PCBs. These forces are transferred down the leads to the solder joints such that radial forces, axial forces, or a combination of radial and axial forces are applied to the solder joints. Over time and after numerous temperature cycles, these forces cause fractures in the solder joints. The fractures in the solder joints cause breaks in signal paths, and thus, premature failures of the circuitry provided by the lighting fixture. Even if the initial fractures do not cause operational failures, arcing often occurs across the fractures and results in further erosion of the solder of the solder joint. Such erosion exacerbates fractures in the solder joint and increases the likelihood of failures in the circuitry.

Accordingly, there is a need for techniques that eliminate, or at least significantly reduce, the forces being imparted on the solder joints within electronic modules that employ potting materials.

SUMMARY

The present disclosure relates to an electronics module, such as driver modules for LED-based lighting fixtures and the like. The electronics module includes a printed circuit board (PCB), a stress mitigation layer, and a potting layer. The PCB has a plurality of vias, which extend through the printed circuit board. A plurality of electronic components may each have a body and a plurality of leads extending from the body and through corresponding ones of the plurality of vias, wherein solder joints electrically and mechanically affix the plurality of leads within the corresponding ones of the plurality of vias. The stress mitigation layer is applied over a top surface of the printed circuit board. The potting layer is applied over the stress mitigation layer and the plurality of electronic components.

In a first embodiment, the stress mitigation layer is a silicone gel or like material that has a material hardness of less than 65 on a Shore type 00 scale, and the potting layer is a silicone encapsulant or like material that has a material hardness between 40 and 85 on a Shore type A scale. In a second embodiment, the stress mitigation layer is a silicone gel or like material that has a material hardness of less than 65 on a Shore type 00 scale, and the potting layer is a silicone encapsulant or like material that has a material hardness between 35 and 90 on a Shore type A scale. In a third embodiment, the stress mitigation layer is a silicone gel or like material that has a material hardness of less than 70 on a Shore type 00 scale, and the potting layer is a silicone encapsulant or like material that has a material hardness between 35 and 90 on a Shore type A scale. In a fourth embodiment, the stress mitigation layer is a silicone gel or like material that has a material hardness of less than 70 on a Shore type 00 scale, and the potting layer is a silicone encapsulant or like material that has a material hardness between 40 and 85 on a Shore type A scale.

Modulus may be another measure of softness, and more particularly, elasticity. In a first embodiment, the stress mitigation layer is a silicone gel or like material that has a modulus of 0.0005 to 0.003 mega-pascal (MPa), and perhaps 0.001 to 0.0015. The potting layer may a have a modulus of 1.0 to 5.0 MPa. In another embodiment, the modulus of the potting layer is at least 50, 100, or 150 times greater than the modulus of the stress mitigation layer.

For any of the above embodiments, the thermal conductivity of the potting layer may be significantly higher than that of the stress mitigation layer. For example, the thermal conductivity of the potting layer may be greater than 0.4, 0.45, or 0.60 watts per meter-kelvin (W/(m k)) with potential upper bounds of 0.75, 1.00, 1.25, and 1.5 W/(m k). The thermal conductivity for the stress mitigation layer may likewise be less than 0.2, 0.1 or 0.05 W/(m k). The stress mitigation layer may be a silicone gel that does not have fillers to enhance thermal conductivity. The potting layer may be silicone that includes fillers, such as quartz, calcium carbonate, or the like to enhance the thermal conductivity of the potting layer. In one embodiment, the potting layer includes silicone and is, by weight, 30% to 70% quartz. Notably, any combination of the specifically listed Shore ratings, modulus values, and thermal conductivity values is considered within the scope of the disclosure. As such, combinations of metrics from the different, specific examples are considered within the scope of the disclosure.

Alone or in combination with the features above, the plurality of leads may have clinched ends as well as formed leads. Formed leads are those that are formed to include at least one non-linear shape between the top surface of the printed circuit board and bottom surface of the bodies of the plurality of electronic components such that forces applied to the bodies of the plurality of electronic components due to expansion and contraction of the potting layer are absorbed by the plurality of leads prior to reaching the solder joints. Clinched ends function to prevent the leads from being pulled upward through the vias.

The stress mitigation layer may be formed such that cavities are provided below certain of the plurality of electronic components. In certain embodiments, the stress mitigation layer covers the top surface of the electronic components. In other embodiments, the stress mitigation layer may not cover the top surfaces of the electronic components.

In certain embodiments, the solder joints withstand fracturing after 600 temperature cycles between −40 Celsius and 105 Celsius.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 8 is a cross-section of an electronics module that employs a multilayer potting scheme according to a second embodiment of the present disclosure.

FIGS. 9A and 9B illustrate embodiments where only certain of the electronic components are surrounded by a stress mitigation layer.

DETAILED DESCRIPTION

Figure 1:
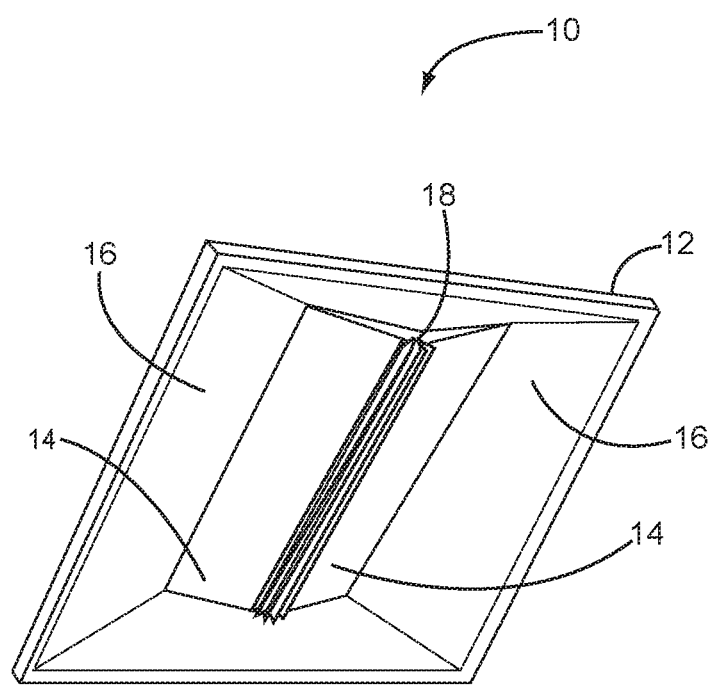
FIG. 1 is a perspective view of a troffer-based lighting fixture according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

The present disclosure relates to an electronics module, such as driver modules for LED-based lighting fixtures and the like. The electronics module includes a printed circuit board (PCB), a stress mitigation layer, and a potting layer. The PCB has a plurality of vias, which extend through the printed circuit board. A plurality of electronic components may each have a body and a plurality of leads extending from the body and through corresponding ones of the plurality of vias, wherein solder joints electrically and mechanically affix the plurality of leads within the corresponding ones of the plurality of vias. The stress mitigation layer is applied over a top surface of the printed circuit board. The potting layer is applied over the stress mitigation layer and the plurality of electronic components. Providing the stress mitigation layer alone or in combination with the additional techniques provides below significantly reduces the forces being imparted on the solder joints within electronic modules that employ potting materials due to expansion and contract of the potting materials.

In a first embodiment, the stress mitigation layer is a silicone gel or like material that has a material hardness of less than 65 on a Shore type 00 scale, and the potting layer is a silicone encapsulant or like material that has a material hardness between 40 and 85 on a Shore type A scale. In a second embodiment, the stress mitigation layer is a silicone gel or like material that has a material hardness of less than 65 on a Shore type 00 scale, and the potting layer is a silicone encapsulant or like material that has a material hardness between 35 and 90 on a Shore type A scale. In a third embodiment, the stress mitigation layer is a silicone gel or like material that has a material hardness of less than 70 on a Shore type 00 scale, and the potting layer is a silicone encapsulant or like material that has a material hardness between 35 and 90 on a Shore type A scale. In a fourth embodiment, the stress mitigation layer is a silicone gel or like material that has a material hardness of less than 70 on a Shore type 00 scale, and the potting layer is a silicone encapsulant or like material that has a material hardness between 40 and 85 on a Shore type A scale.

Modulus may be another measure of softness, and more particularly, elasticity. In a first embodiment, the stress mitigation layer is a silicone gel or like material that has a modulus of 0.0005 to 0.003 mega-pascal (MPa), and perhaps 0.001 to 0.0015. The potting layer may a have a modulus of 1.0 to 5.0 MPa. In another embodiment, the modulus of the potting layer is at least 50, 100, or 150 times greater than the modulus of the stress mitigation layer.

For any of the above embodiments, the thermal conductivity of the potting layer may be significantly higher than that of the stress mitigation layer. For example, the thermal conductivity of the potting layer may be greater than 0.4, 0.45, or 0.60 watts per meter-kelvin (W/(m k) with potential upper bounds of 0.75, 1.00, 1.25, and 1.5 W/(m k). The thermal conductivity for the stress mitigation layer may likewise be less than 0.2, 0.1 or 0.05 W/(m k). The stress mitigation layer may be a silicone gel that does not have fillers to enhance thermal conductivity. The potting layer may be silicone that includes fillers, such as quartz, calcium carbonate, or the like to enhance the thermal conductivity of the potting layer 68. In one embodiment, the potting layer includes silicone and is, by weight, 30% to 70% quartz. Notably, any combination of the specifically listed Shore ratings, modulus values, and thermal conductivity values is considered within the scope of the disclosure. As such, combinations of metrics from the different, specific examples are considered within the scope of the disclosure.

Alone or in combination with the features above, the plurality of leads may have clinched ends as well as formed leads. Formed leads are those that are formed to include at least one non-linear shape between the top surface of the printed circuit board and bottom surface of the bodies of the plurality of electronic components such that forces applied to the bodies of the plurality of electronic components due to expansion and contraction of the potting layer are absorbed by the plurality of leads prior to reaching the solder joints. Clinched ends function to prevent the leads from being pulled upward through the vias.

The stress mitigation layer may be formed such that cavities are provided below certain of the plurality of electronic components. In certain embodiments, the stress mitigation layer covers the top surface of the electronic components. In other embodiments, the stress mitigation layer may not cover the top surfaces of the electronic components.

Prior to delving into the details of the present disclosure, an overview of an exemplary lighting fixture is provided. While the concepts of the present disclosure may be employed in any type of electronic system, the immediately following description describes these concepts in a troffer-type lighting fixture, such as the lighting fixture 10 illustrated in FIGS. 1-3. This particular lighting fixture is substantially similar to the CR and CS series of troffer-type lighting fixtures that are manufactured by Cree, Inc. of Durham, N.C.

Figure 2:
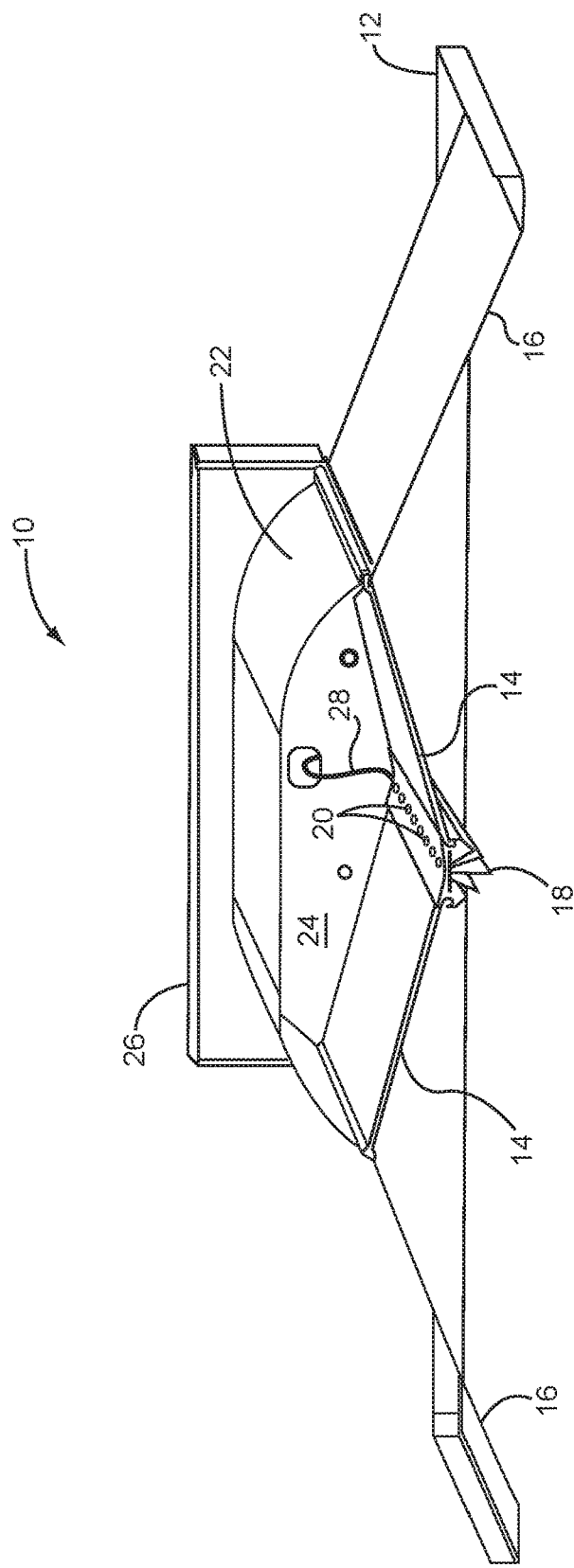
FIG. 2 is a cross-section of the lighting fixture of FIG. 1.
Figure 3:
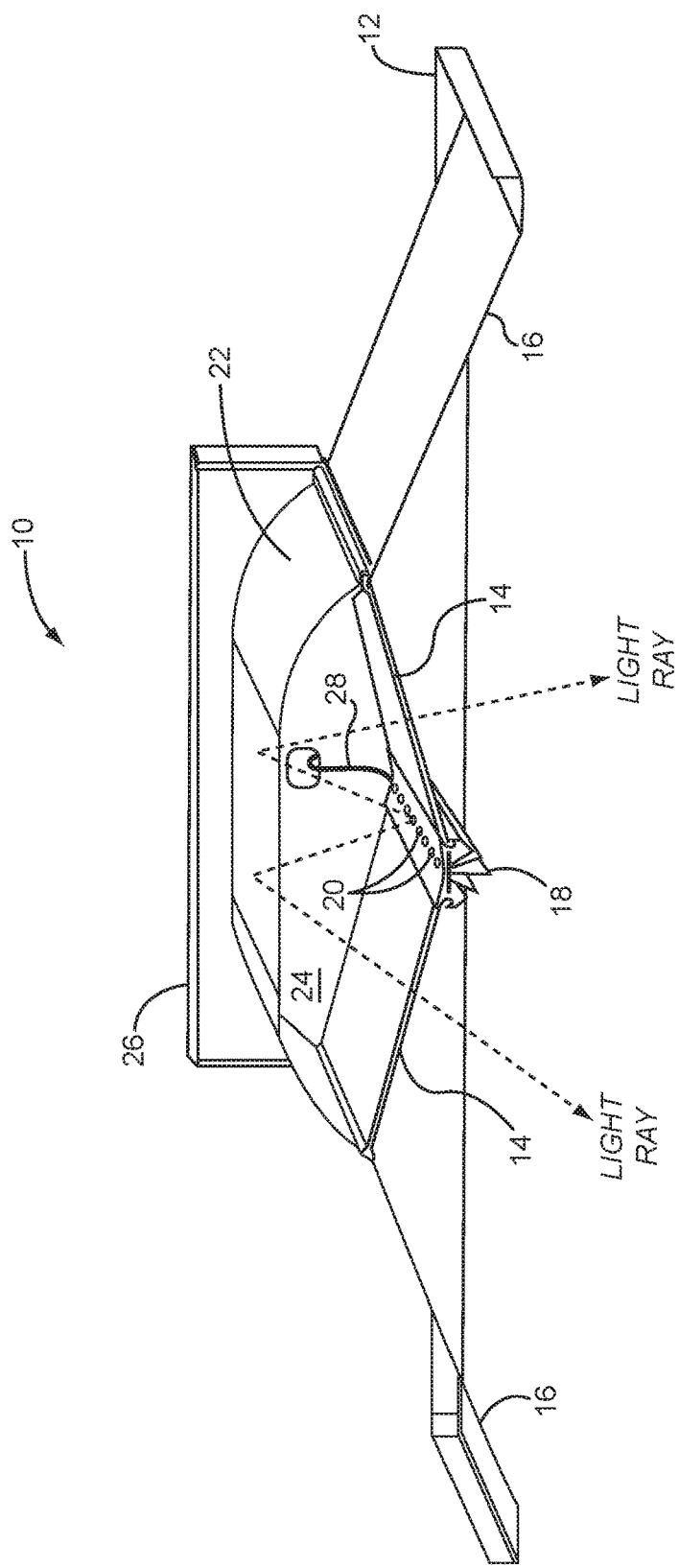
FIG. 3 is a cross-section of the lighting fixture of FIG. 1 illustrating how light emanates from the LEDs of the lighting fixture and is reflected out through lenses of the lighting fixture.

In general, troffer-type lighting fixtures, such as the lighting fixture 10, are designed to mount in, on, or from a ceiling. In most applications, the troffer-type lighting fixtures are mounted into a drop ceiling (not shown) of a commercial, educational, or governmental facility. As illustrated in FIGS. 1-3, the lighting fixture 10 includes a square or rectangular outer frame 12. In the central portion of the lighting fixture 10 are two rectangular lenses 14, which are generally transparent, translucent, or opaque. Reflectors 16 extend from the outer frame 12 to the outer edges of the lenses 14. The lenses 14 effectively extend between the innermost portions of the reflectors 16 to an elongated heatsink 18, which functions to join the two inside edges of the lenses 14.

Turning now to FIGS. 2 and 3 in particular, the back side of the heatsink 18 provides a mounting structure for a solid-state light source, such as an LED array 20, which includes one or more rows of individual LEDs mounted on an appropriate substrate. The LEDs are oriented to primarily emit light upwards toward a concave cover 22. The volume bounded by the cover 22, the lenses 14, and the back of the heatsink 18 provides a mixing chamber 24. As such, light will emanate upwards from the LEDs of the LED array 20 toward the cover 22 and will be reflected downward through the respective lenses 14, as illustrated in FIG. 3. Notably, not all light rays emitted from the LEDs will reflect directly off of the bottom of the cover 22 and back through a particular lens 14 with a single reflection. Many of the light rays will bounce around within the mixing chamber 24 and effectively mix with other light rays, such that a desirably uniform light is emitted through the respective lenses 14.

Those skilled in the art will recognize that the type of lenses 14, the type of LEDs, the shape of the cover 22, and any coating on the bottom side of the cover 22, among many other variables, will affect the quantity and quality of light emitted by the lighting fixture 10. As will be discussed in greater detail below, the LED array 20 may include LEDs of different colors, wherein the light emitted from the various LEDs mixes together to form a white light having a desired characteristic, such as spectral content (color or color temperature), color rendering index (CRI), output level, and the like based on the design parameters for the particular embodiment, environmental conditions, or the like.

As is apparent from FIGS. 2 and 3, the elongated fins of the heatsink 18 may be visible from the bottom of the lighting fixture 10. Placing the LEDs of the LED array 20 in thermal contact along the upper side of the heatsink 18 allows any heat generated by the LEDs to be effectively transferred to the elongated fins on the bottom side of the heatsink 18 for dissipation within the room in which the lighting fixture 10 is mounted. An electronics housing 26 is shown at one end of the lighting fixture 10, and is used to mount or house all or a portion of the electronics (not shown) associated with the lighting fixture.

Figure 4:
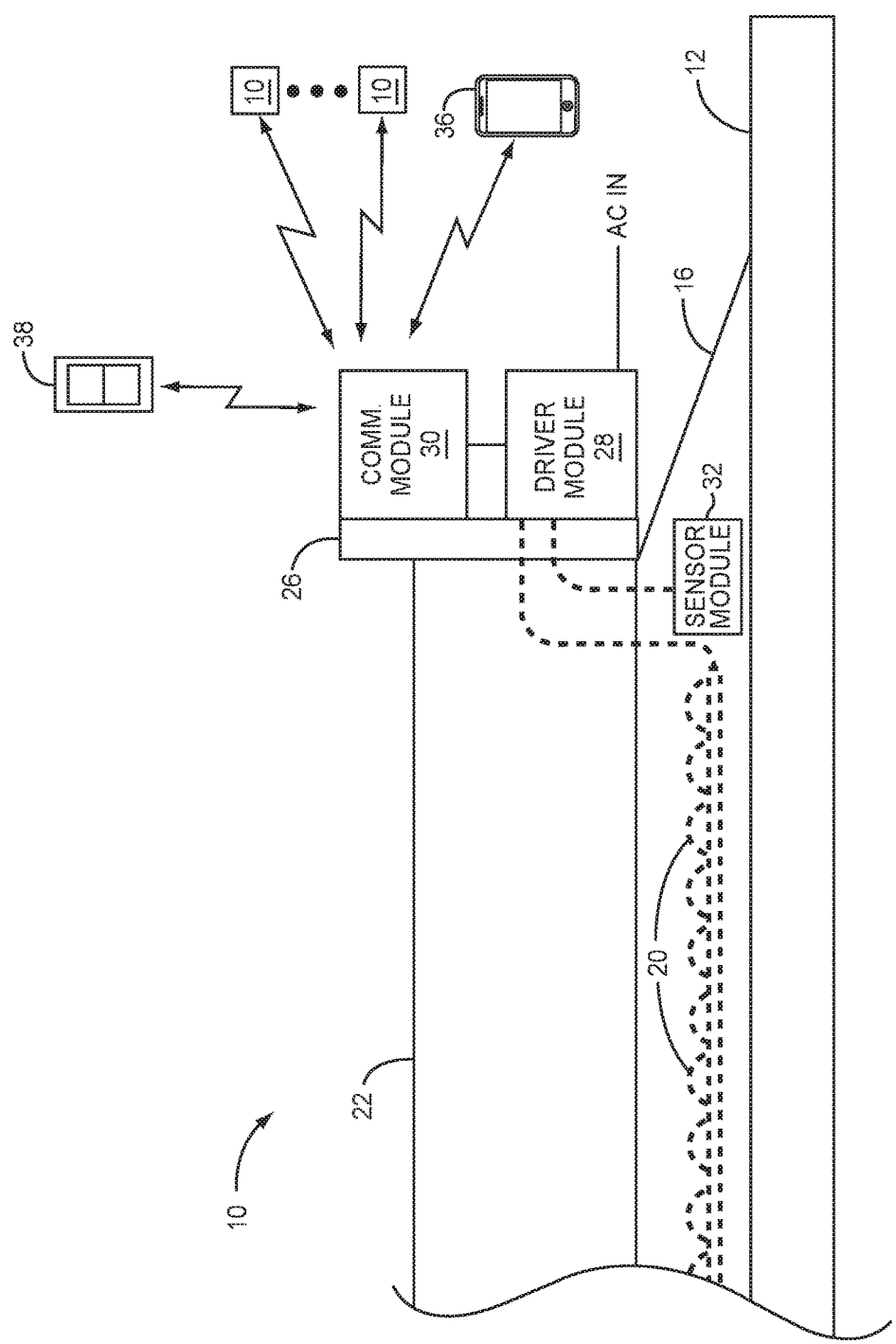
FIG. 4 illustrates a driver module and a communications module integrated within an electronics housing.

As illustrated in FIG. 4, the electronics may be broken into a driver module 28, a communications module 30, and one or more sensors. In the illustrated embodiment, the sensors are integrated into a sensor module 32. The sensors may include one or more ambient light, occupancy (motion), sound, temperature, humidity, vibration, image, or like sensors. At a high level, the driver module 28 is coupled to the LED array 20 through appropriate cabling and directly drives the LEDs of the LED array 20. In one embodiment, the driver module 28 provides the primary intelligence for the lighting fixture 10 and is capable of driving the LEDs of the LED array 20 in a desired fashion. The communications module 30 acts as a communication interface, which facilitates wired or wireless communications between the driver module 28 and a control device 36, other lighting fixtures 10, wall controllers 38, and the like. The driver module 28 will drive the LED array 20 based on its internal logic in light of information provided by the sensor module 32 and received via the communications module 30. The information received via the communications module 30 may include information gathered from the wall controllers 38, other lighting fixtures 10, control device 36, or any combination thereof.

In alternative embodiments, the driver module 28 is configured to drive the LEDs of the LED array 20 based simply on instructions from the communications module 30. In such an embodiment, the primary intelligence of the lighting fixture 10 is provided in the communications module 30, which effectively becomes an overall control module with integrated wired or wireless communication capability. As such, the communications module 30 will provide instructions on how to drive the LED array 20 to the driver module 28 based on its internal logic in light of information provided by the sensor module 32, wall controllers 38, other lighting fixtures 10, control device 36, or a combination thereof.

Regardless of whether primary control resides in the driver module 28 or the communications module 30, the lighting fixture 10 may also share information, including sensor data, or provide instructions to other lighting fixtures 10, the control device 36, and the like. In essence, the communications module 30 facilitates the sharing of intelligence and data among the lighting fixtures 10 and other entities, and in certain embodiments, may act as the primary controller for the lighting fixture 10.

Figure 5:
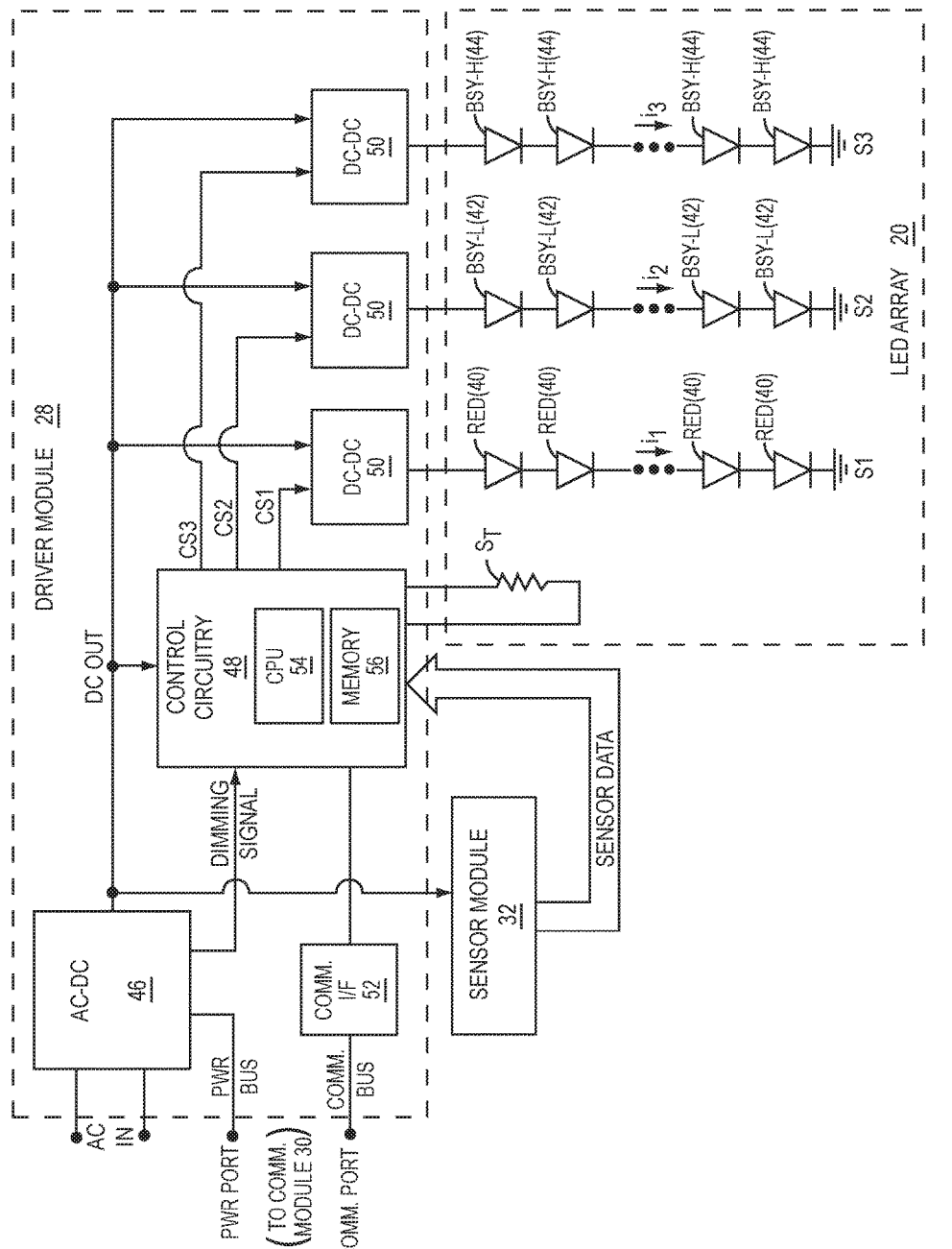
FIG. 5 illustrates a driver module provided in an electronics housing and a communications module in an associated housing coupled to the exterior of the electronics housing.

FIG. 5 provides an exemplary schematic of the driver module 28, the LED array 20, and the sensor module 32. In the illustrated embodiment, the LED array 20 may include a mixture of LEDs of different colors. While those skilled in the art will recognize various color combinations, the following example employs red LEDs 40 that emit reddish light at a first wavelength, blue shifted yellow (BSY) LEDs 42 that emit yellowish/greenish light at a second wavelength, and BSY LEDs 44 that emit yellowish/greenish light at a third wavelength, which is different than the second wavelength. The LED array 20 may be divided into multiple strings of series connected LEDs. In essence, LED string S1, which includes a number of red LEDs 40, forms a first group of LEDs. LED string S2, which includes BSY LEDs 42, forms a second group of LEDs. LED string S3, which includes BSY LEDs 44, forms a third group of LEDs.

In general, the driver module 28 controls the drive currents $i_1$, $i_2$, and $i_3$, which are used to drive the respective LED strings S1, S2, and S3. The ratio of drive currents $i_1$, $i_2$, and $i_3$ that are provided through respective LED strings S1, S2, and S3 may be adjusted to effectively control the relative intensities of the reddish light emitted from the red LEDs 40 of LED string S1, the yellowish/greenish light emitted from the BSY LEDs 42 of LED string S2, and the yellowish/greenish light emitted from the BSY LEDs 44 of LED string S3. The resultant light from each LED string S1, S2, and S3 mixes to generate an overall light output that has a desired color, correlated color temperature (CCT), and intensity, the latter of which may also be referred to a dimming level. As noted, the overall light output may be white light that falls on or within a desired proximity of the Black Body Locus (BBL) and has a desired CCT.

The number of LED strings Sx may vary from one to many and different combinations of LED colors may be used in the different strings. Each LED string Sx may have LEDs of the same color, variations of the same color, or substantially different colors. In the illustrated embodiment, each LED string S1, S2, and S3 is configured such that all of the LEDs 40, 42, 44 that are in the string are all essentially identical in color. However, the LEDs 40, 42, 44 in each string may vary substantially in color or be completely different colors in certain embodiments. In another embodiment, three LED strings Sx with red, green, and blue LEDs may be used, wherein each LED string Sx is dedicated to a single color. In yet another embodiment, at least two LED strings Sx may be used, wherein the same or different colored BSY or blue shifted green (BSG) LEDs are used in one of the LED strings Sx and red LEDs are used in the other of the LED strings Sx. A single string embodiment is also envisioned, where currents may be individually adjusted for the LEDs of the different colors using bypass circuits, or the like.

The driver module 28 depicted in FIG. 5 generally includes AC-DC conversion circuitry 46, control circuitry 48, and a number of current sources, such as the illustrated DC-DC converters 50. The AC-DC conversion circuitry 46 is adapted to receive an AC power signal (AC IN), rectify the AC power signal, correct the power factor of the AC power signal, and provide a DC output signal. The DC output signal may be used to directly or indirectly power the control circuitry 48 and any other circuitry provided in the driver module 28, including the DC-DC converters 50, a communication interface (I/F) 52, as well as the sensor module 32.

The DC output signal may also be provided to a power bus, which is coupled to one or more power ports, which may be part of the standard communication interface. The DC output signal provided to the power bus may be used to provide power to one or more external devices that are coupled to the power bus and are separate from the driver module 28. These external devices may include the communications module 30 and any number of auxiliary devices, such as the sensor module 32. Accordingly, these external devices may rely on the driver module 28 for power and can be efficiently and cost effectively designed accordingly. The AC-DC conversion circuitry 46 of the driver module 28 is robustly designed in anticipation of being required to supply power to not only its internal circuitry and the LED array 20, but also to supply power to these external devices. Such a design greatly simplifies the power supply design, if not eliminating the need for a power supply, and reduces the cost for these external devices.

As illustrated, the three respective DC-DC converters 50 of the driver module 28 provide drive currents $i_1$, $i_2$, and $i_3$ for the three LED strings S1, S2, and S3 in response to control signals CS1, CS2, and CS3. The control signals CS1, CS2, and CS3 may be pulse width modulated (PWM) signals that effectively turn the respective DC-DC converters on during a logic high state and off during a logic low state of each period of the PWM signal. As a result, the drive currents $i_1$, $i_2$, and $i_3$ for the three LED strings S1, S2, and S3 may also be PWM signals. The intensity of light emitted from each of the three LED strings S1, S2, and S3 will vary based on the duty cycle of the respective PWM signals.

In certain instances, a dimming device may control the AC power signal. The AC-DC conversion circuitry 46 may be configured to detect the relative amount of dimming associated with the AC power signal and provide a corresponding dimming signal (DIMMING SIGNAL) to the control circuitry 48. Based on the dimming signal, the control circuitry 48 will adjust the duty cycle of the drive currents $i_1$, $i_2$, and $i_3$ provided to each of the LED strings S1, S2, and S3 to effectively adjust the intensity of the resultant light emitted from the LED strings S1, S2, and S3 while maintaining the desired CCT.

The color, CCT, and intensity of the light emitted from the LEDs may be affected by temperature. If associated with a thermistor $S_T$ or other temperature-sensing device, the control circuitry 48 can control the drive currents $i_1$, $i_2$, and $i_3$ provided to each of the LED strings S1, S2, and S3 based on the ambient temperature of the LED array 20 in an effort to compensate for temperature effects. The control circuitry 48 may receive data from the sensor module 32. The sensor data may be processed by the control circuitry 48 to make occupancy determinations, determine ambient light levels, and control the drive currents $i_1$, $i_2$, and $i_3$ in a desired fashion based on the occupancy conditions and ambient light levels.

The control circuitry 48 may include a central processing unit (CPU) 54 and sufficient memory 56 to enable the control circuitry 48 to bidirectionally communicate with the communications module 30 or other devices over the communication bus through communication interface 52 using a defined protocol, such as the standard protocol described above. The control circuitry 48 may receive data or instructions from the communications module 30 or other device and take appropriate action to process the data and implement the received instructions. The instructions may range from controlling how the LED array 20 is driven to returning operational data, such as image, temperature, occupancy, light output, or ambient light information, that was collected by the control circuitry 48 to the communications module 30 or other device via the communication bus. Notably, the functionality of the communications module 30 may be integrated into the driver module 28, and vice versa.

Notably, when the term "control system" is used in the claims or generically in the specification, the term should be construed broadly to include the hardware and any additional software or firmware that is needed to provide the stated functionality. The term "control system" should not be construed as only software, as electronics are needed to implement control systems described herein. For example, a control system may, but does not necessarily, include the control circuitry 48, the DC-DC converters 50, the AC-DC conversion circuitry 46, and the like.

Figure 6:
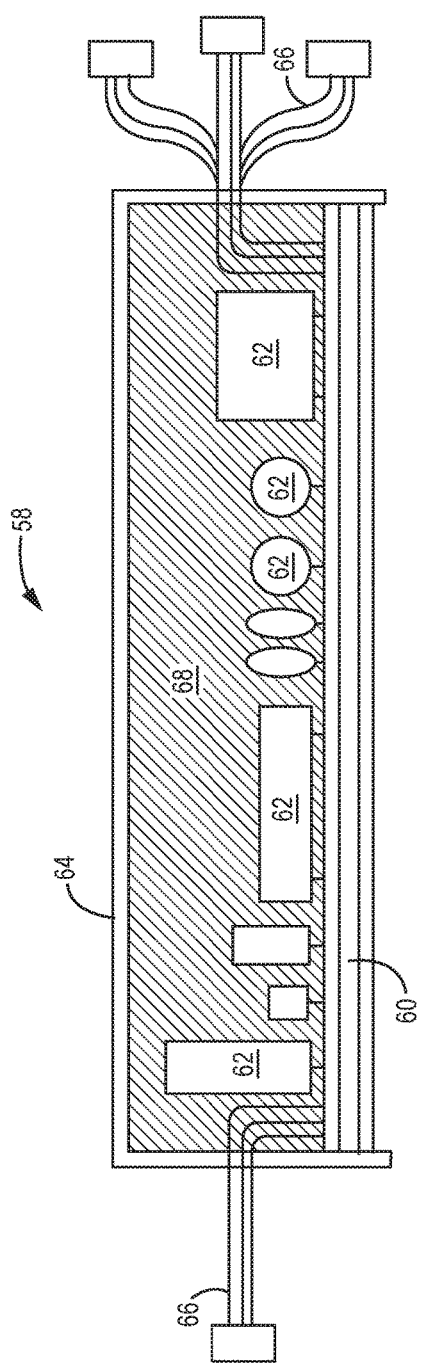
FIG. 6 is a cross-section of an electronics module according to the related art.

FIG. 6 illustrates an electronic module 58, such as the driver module 28 or communications module 30, which is assembled in traditional fashion. In general, a printed circuit board (PCB) 60 will have any number of electronic components 62 mounted on at least one surface of the PCB 60. For clarity, note that not all of the electronic components 62 have a unique reference. These electronic components 62 may include both passive and active components, such as resistors, capacitors, inductors, transformers, integrated circuits (ICs), connectors, transistors, diodes, and the like. These electronic components 62 are electrically connected by traces on and in the PCB 60 in such a manner to provide the electronic functionality required of the electronic module 58. In many instances, the PCB 60 and the electronic components 62 thereon are mounted within a housing 64, such that the housing and PCB 60 define an interior region in which at least some of the electronic components 62 reside. Cabling 66 or appropriate connectors may extend through one or more walls of the housing 64 or the PCB 60 to provide electrical access to other modules and components. If the electronic module 58 takes the form of the driver module 28, the cabling 66 may facilitate connections to AC power AC IN, the communications module 30, the LED array 20, and the sensor module 32.

To protect the electronic components 62 from environmental conditions as well as to help dissipate heat generated by the electronic components 62, a potting material, such as silicone, may be used to fill the region defined by the interior of the housing 64 and the PCB 60. The potting material is referred to as a potting layer 68, which completely, or at least substantially, fills the region defined by the interior surfaces of the housing 64 and the PCB 60.

Unfortunately, silicone, like many other potting materials, expands and contracts with increasing and decreasing ambient temperatures. When silicone is used for the potting layer 68, the cyclic expansion and contraction of the potting layer 68 results in fracturing of the solder joints, which are used to electrically and mechanically couple the leads of the electronic components 62 to the vias (not shown) of the PCB 60. The fracturing of the solder joints often leads to electrical failure, especially when the fractures are sufficient enough to trigger arcing. Arcing over time tends to erode the solder, which leads to undesired permanent or intermittent opens in a circuit path. These opens lead directly to operational failures.

The expansion and contraction of those portions of the potting layer 68 that reside between the bottoms of the electronic components 62 and the surface of the PCB 60 can also lead to damage of the electronic components 62. In many instances, the package for the electronic components 62 is fractured due to the pressures exerted on the package by the silicone potting layer 68. Such fractures may directly damage the electronic structure of the electronic components 62 and/or make the electronic structure vulnerable to environmental conditions, both of which may lead to failure of the electronic components 62. Accordingly, there is a need for a potting technique that prevents, or at least significantly reduces the risk of, damage to solder joints and the electronic components 62 due to the expansion and/or contraction of the potting layer 68. One such technique is illustrated in FIG. 7, according to one embodiment of the disclosure.

Figure 7:
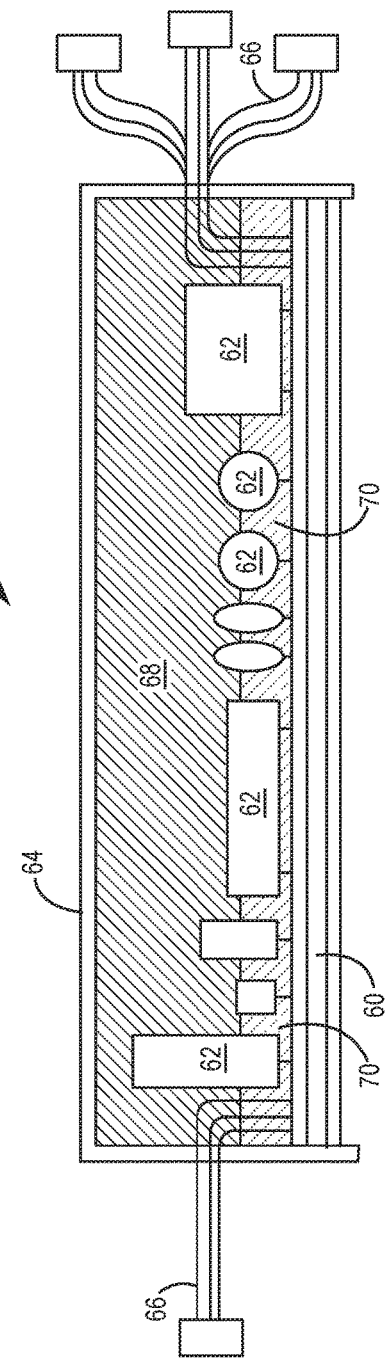
FIG. 7 is a cross-section of an electronics module that employs a multilayer potting scheme according to a first embodiment of the present disclosure.

In the embodiment of FIG. 7, a stress mitigation layer 70 is provided over the surface of the PCB 60 such that the stress mitigation layer 70 resides between the surface of the PCB 60 and the potting layer 68. The stress mitigation layer 70 may be formed from silicone, such as a silicone gel, or like material. As noted above, silicone is a common material used for the potting layer 68, but other materials such as asphalt, tar, and the like may be used.

As described further below, the material used for the stress mitigation layer 70 may or may not form beneath at least certain electronic components 62, such that an air cavity is formed beneath certain electronic components 62. The air cavity beneath an electronic component 62 is essentially defined by a surface of the PCB 60, a bottom surface of the electronic components 62, and one or more sidewalls of an opening formed in the stress mitigation layer 70. For the embodiment of FIG. 7, the stress mitigation layer 70 has a thickness sufficient to encompass most, if not all, of the leads of the various electronic components 62. However, the stress mitigation layer 70 is generally formed around, but not over top of, most of the electronic components 62. As such, portions of most, if not all, of the electronic components 62 are covered by the potting layer 68.

Figure 9B:
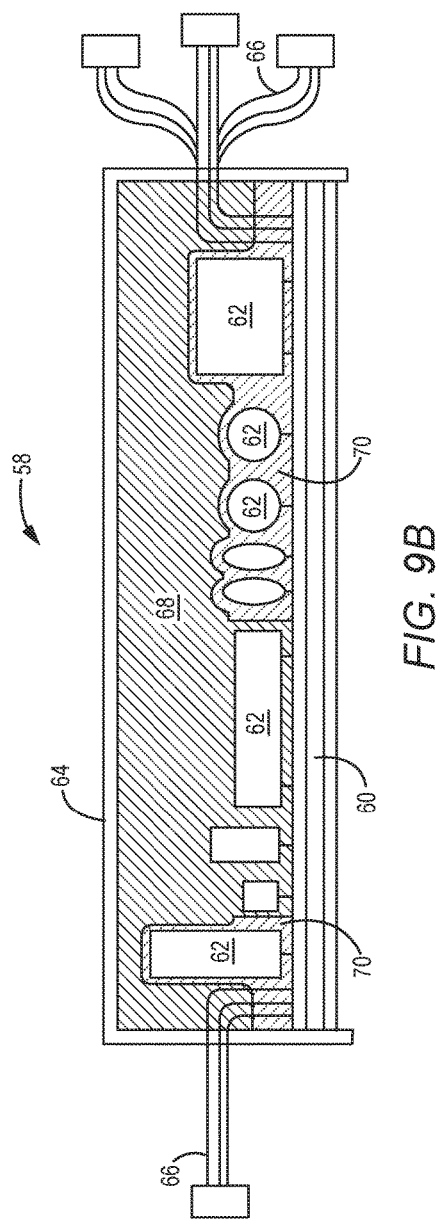

In an alternative embodiment, the stress mitigation layer 70 may be formed such that it substantially encapsulates the electronic components 62 so the material used to form the stress mitigation layer 70 surrounds the sides of and covers the top of most, if not all, of the electronic components 62, as illustrated in FIG. 8. Again, air cavities may be formed within the stress mitigation layer 70 beneath certain of the electronic components 62. Air cavities are particularly beneficial beneath electronic components 62 that are susceptible to being fractured or otherwise damaged due to expansions of materials trapped between the bottom of the electronic components 62 and the PCB 60. As illustrated in FIGS. 9A and 9B, the stress mitigation layer 70 may be applied to or about only select electronic components 62, such as those that are most susceptible to damage from the expansion and/or contraction of potting materials. Accordingly, certain electronic components 62 may be surrounded by just the potting material 68 while others are surrounded and/or covered by both the stress mitigation layer 70 and the potting material 68.

In certain embodiments, the material used to form the stress mitigation layer 70 is softer than, if not significantly softer than, the material used to form the potting layer 68. The relative hardness or softness of materials, such as the elastomeric materials used for the stress mitigation layer 70 and the potting layer 68, may be characterized using appropriate durometer scales, such as the widely used Shore Type A and Shore Type 00 durometer scales, which are defined by ASTM (American Society for Testing and Materials) standard D2240.

In a first embodiment, the stress mitigation layer 70 is a silicone gel or like material that has a material hardness of less than 65 on a Shore type 00 scale, and the potting layer 68 is a silicone encapsulant or like material that has a material hardness between 40 and 85 on a Shore type A scale. In a second embodiment, the stress mitigation layer 70 is a silicone gel or like material that has a material hardness of less than 65 on a Shore type 00 scale, and the potting layer 68 is a silicone encapsulant or like material that has a material hardness between 35 and 90 on a Shore type A scale. In a third embodiment, the stress mitigation layer 70 is a silicone gel or like material that has a material hardness of less than 70 on a Shore type 00 scale, and the potting layer 68 is a silicone encapsulant or like material that has a material hardness between 35 and 90 on a Shore type A scale. In a fourth embodiment, the stress mitigation layer 70 is a silicone gel or like material that has a material hardness of less than 70 on a Shore type 00 scale, and the potting layer 68 is a silicone encapsulant or like material that has a material hardness between 40 and 85 on a Shore type A scale.

Modulus may be another measure of softness, and more particularly, elasticity. In a first embodiment, the stress mitigation layer 70 is a silicone gel or like material that has a modulus of 0.0005 to 0.003 mega-pascal (MPa), and perhaps 0.001 to 0.0015. The potting layer 68 may a have a modulus of 1.0 to 5.0 MPa. In another embodiment, the modulus of the potting layer 68 is at least 50, 100, or 150 times greater than the modulus of the stress mitigation layer 70.

For any of the above embodiments, the thermal conductivity of the potting layer 68 may be significantly higher than that of the stress mitigation layer 70. For example, the thermal conductivity of the potting layer 68 may be greater than 0.4, 0.45, or 0.60 watts per meter-kelvin (W/(m k) with potential upper bounds of 0.75, 1.00, 1.25, and 1.5 W/(m k). The thermal conductivity for the stress mitigation layer 70 may likewise be less than 0.2, 0.1 or 0.05 W/(m k). The stress mitigation layer 70 may be a silicone gel that does not have fillers to enhance thermal conductivity. The potting layer 68 may be silicone that includes fillers, such as quartz, calcium carbonate, or the like to enhance the thermal conductivity of the potting layer 68. In one embodiment, the potting layer includes silicone and is, by weight, 30% to 70% quartz. Notably, any combination of the specifically listed Shore ratings, modulus values, and thermal conductivity values is considered within the scope of the disclosure. As such, combinations of metrics from the different, specific examples are considered within the scope of the disclosure.

Notably, including a stress mitigation layer 70 between the PCB 60 and the potting layer 68 has proven to significantly reduce the forces exerted on the electronic components 62 due to subjecting the electronic module 58 to temperature cycling. By reducing these forces, solder joint fractures are also significantly reduced. The following description provides additional techniques to combine with the use of the stress mitigation layer 70 to even further reduce solder joint fractures.

Figure 10:
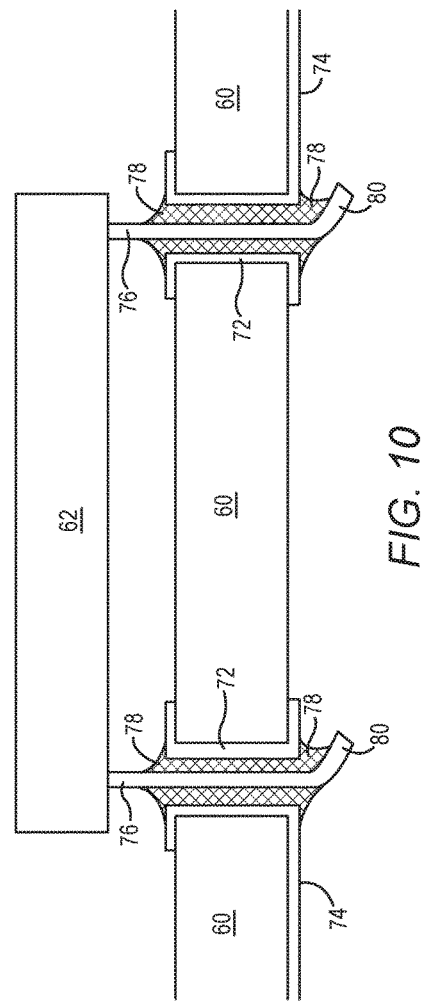
FIG. 10 is a cross-section of an electronic component that is mounted to a printed circuit board, wherein the leads of the electronic component are clinched.

FIG. 10 illustrates the concept of lead clinching. In particular, the PCB 60 includes multiple vias 72 and traces 74 that extend from the vias 72. The electronic component 62 includes at least two leads 76 that extend through the vias 72. Solder 78 is used to electrically and mechanically couple the leads 76 and the respective vias 72. The leads 76 extend completely through the vias 72 and past the bottom surface of the vias 72. The portion of the leads 76 that extend past the bottom surface of the vias 72 are bent at an angle, such that a clinched end 80 is provided at the end of each lead 76. The clinched ends 80 functions to prevent the leads 76 from being pulled upward through the vias 72 due to the expansion and/or contraction of the potting layer 68 and/or the stress mitigation layer 70. Without the clinched ends 80, the leads 76 are much easier to be pulled loose from and up through the solder 78. Clinching the ends of the lead 76 in combination with the use of the stress mitigation layer 70 significantly reduces the likelihood of solder fractures about the leads 76.

Figure 11:
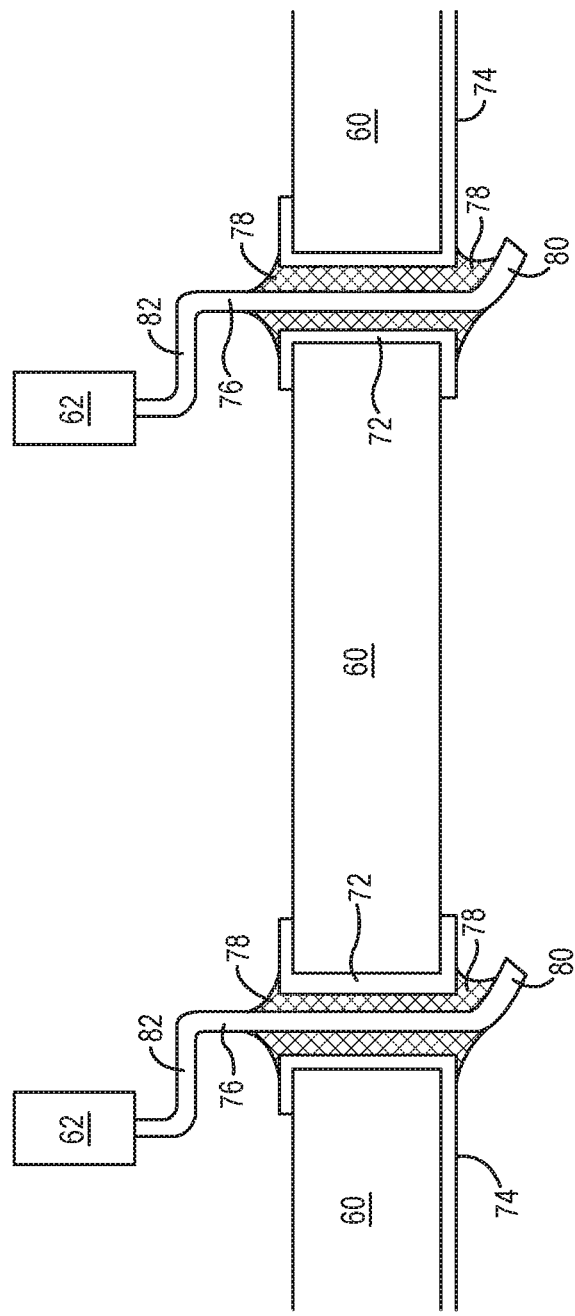
FIG. 11 is a cross-section of an electronic component that is mounted to a printed circuit board, wherein the leads of the electronic component are both formed in a first manner and clinched.

FIG. 11 illustrates the concept of lead forming. For each lead 76 of an electronic component 62, a formed portion 82 of the lead 76 resides between the PCB 60 and the body of the electronic component 62 and is shaped such that forces imparted on the body of the electronic component 62 are not fully transferred to the portion of the lead that is soldered within the corresponding via 72. In essence, the formed portions 82 of the leads 76 include two opposing bands that effectively act like shock absorbers or springs between the fixed portion of the leads 76 that are soldered within the vias 72 and the body of the electronic component 62. As illustrated in FIG. 11, the formed portions 82 of the leads 76 include two 90° bends, which oppose one another.

Figure 12:
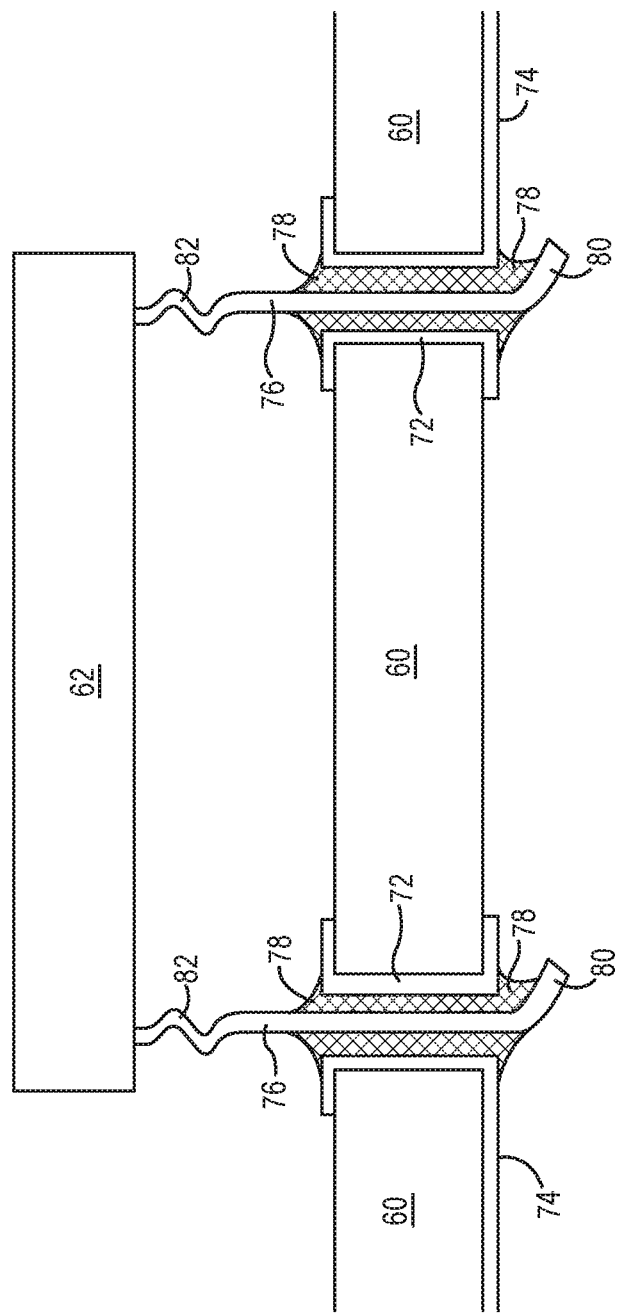
FIG. 12 is a cross-section of an electronic component that is mounted to a printed circuit board, wherein the leads of the electronic component are both formed in a second manner and clinched.

FIG. 12 illustrates an alternative embodiment, wherein the formed portions 82 of the leads 76 include four bends that are in series with and opposite one another. Those skilled in the art will recognize additional shapes for the formed portions 82 of the leads 76. The formed portions 82 of the leads 76 should be designed to mitigate the stresses imparted on those portions of the leads 76 that are soldered to the vias 72 from the body of the electronic component 62 moving in all directions relative to the PCB 60 in response to the thermal expansion and contraction of the potting layer 68 and the stress mitigation layer 70. As illustrated, the lead 76 may also include clinched ends 80 to resist those forces tending to pull the leads 76 up through the vias 72. The combination of the formed portions 82 and the clinched ends 80 of the leads 76, especially in further combination with the stress mitigation layer 70, further reduces the likelihood of solder fractures about the leads 76.

Figure 13:
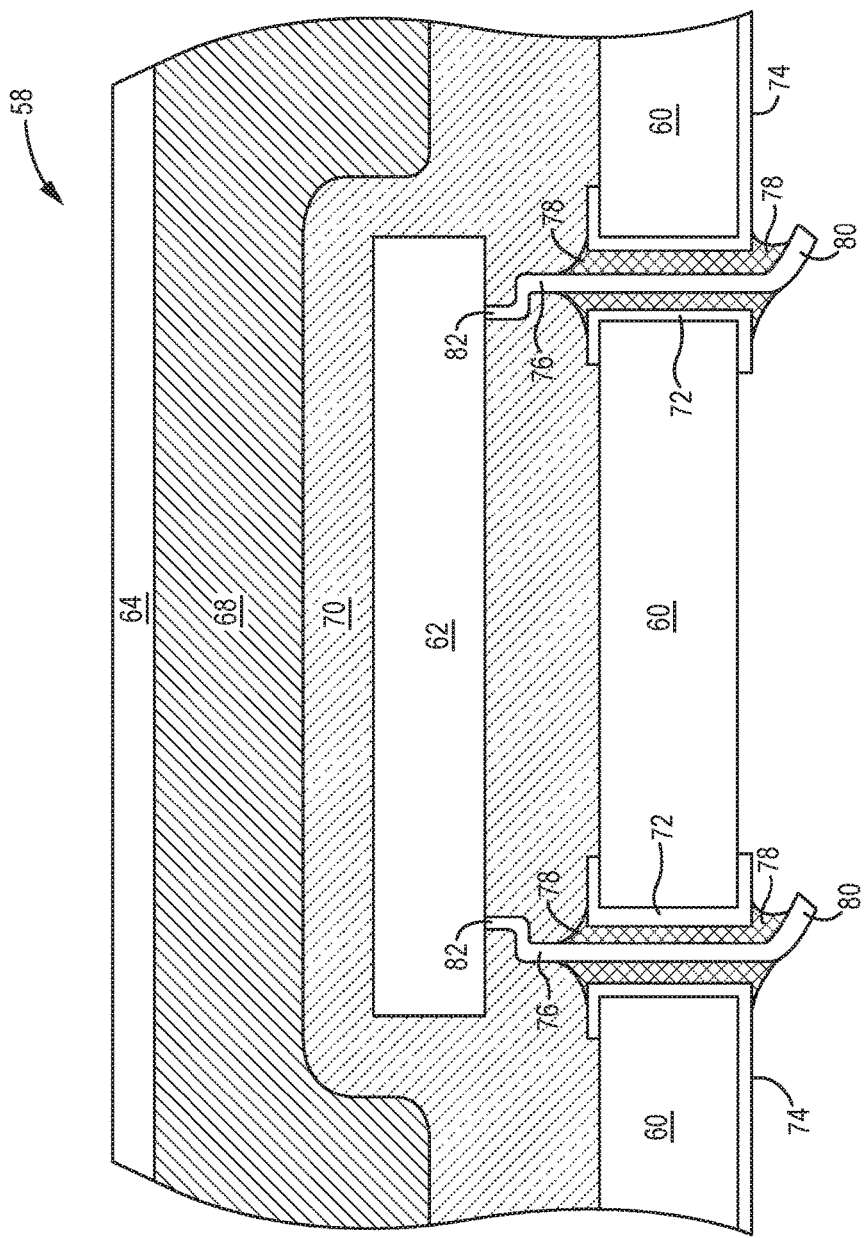
FIG. 13 is a cross-section of a portion of an electronics module wherein a stress mitigation layer substantially encapsulates the body of an electronic component.
Figure 14:
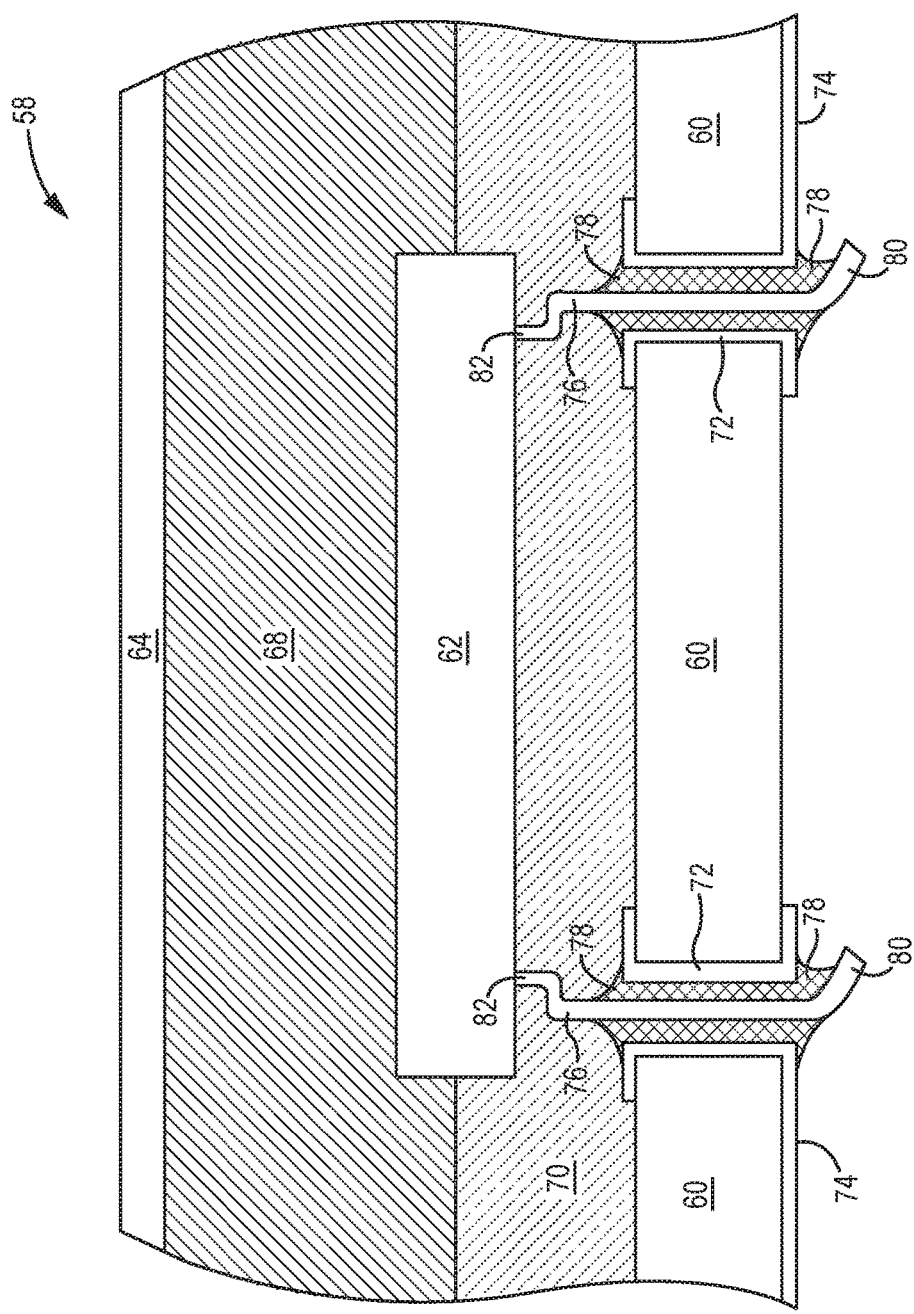
FIG. 14 is a cross-section of a portion of the electronics module, wherein a stress mitigation layer substantially surrounds and under-fills the body of the electronic component, wherein a top surface of the electronic component is not covered by the stress mitigation layer.

Turning now to FIG. 13, an electronic component 62 is shown coupled to the PCB 60. In this embodiment, the stress mitigation layer 70 effectively encapsulates the electronic component 62 such that portions of the stress mitigation layer 70 fill the room between electronic component 62 and the PCB 60, as well as cover an upper surface of the electronic component 62. In FIG. 14, a thinner version of the stress mitigation layer 70 is illustrated wherein, at least for certain electronic components 62, the stress mitigation layer 70 does not cover the upper surface or upper portions of the sides of the electronic components 62. In both FIGS. 13 and 14, portions of the stress mitigation layer 70 fill in the region between the bottom surface of the electronic component 62 and a top surface of the PCB 60. In other words, air or other gas-filled cavities are not provided between the bottom surface of the electronic component 62 and the top surface of the PCB 60. The leads 76 may include clinched ends 80 below the PCB 60 and formed portions 82 above the PCB 60.

Figure 15:
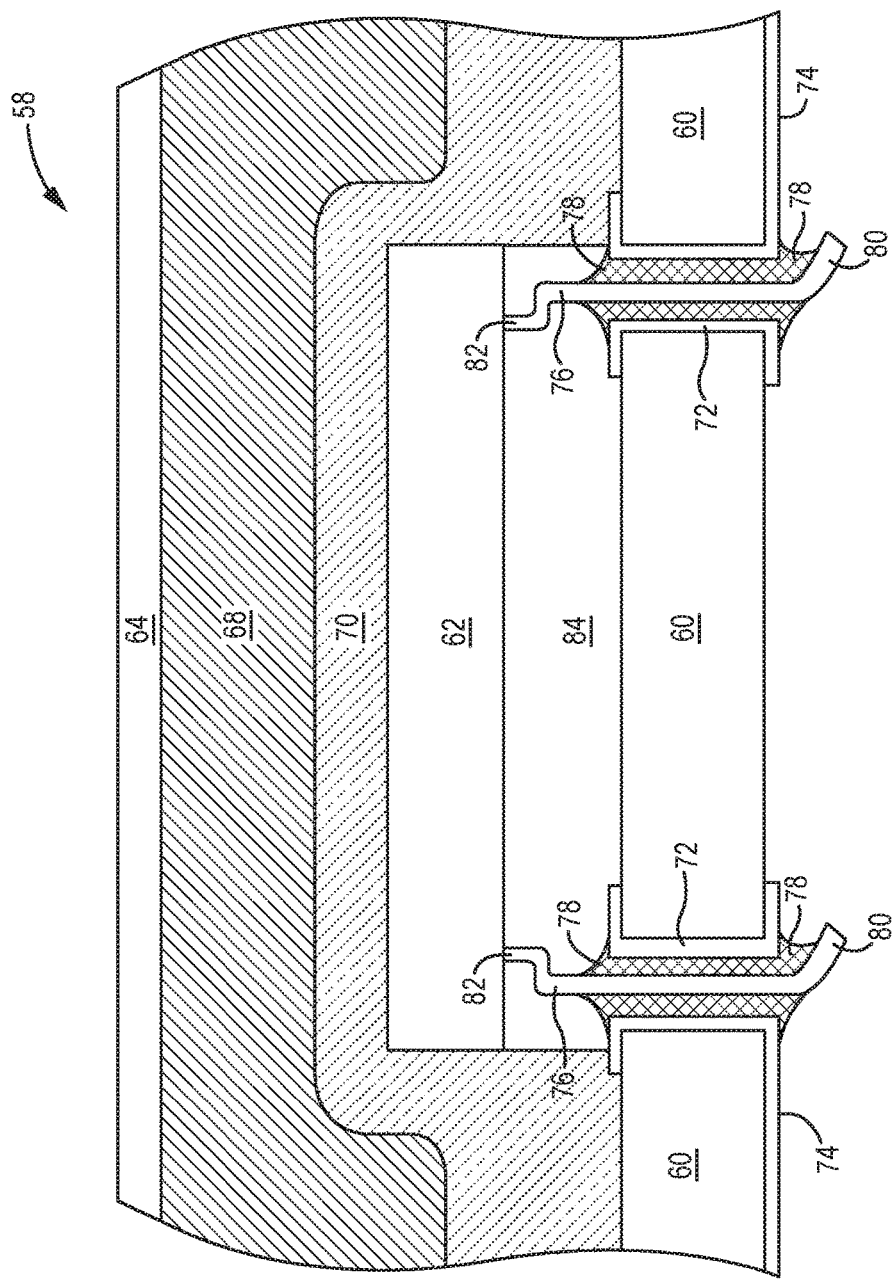
FIG. 15 is a cross-section of a portion of the electronics module, wherein a stress mitigation layer substantially covers the body of the electronic component and a cavity is formed between a bottom surface of the electronic component and a top surface of the printed circuit board.
Figure 16:
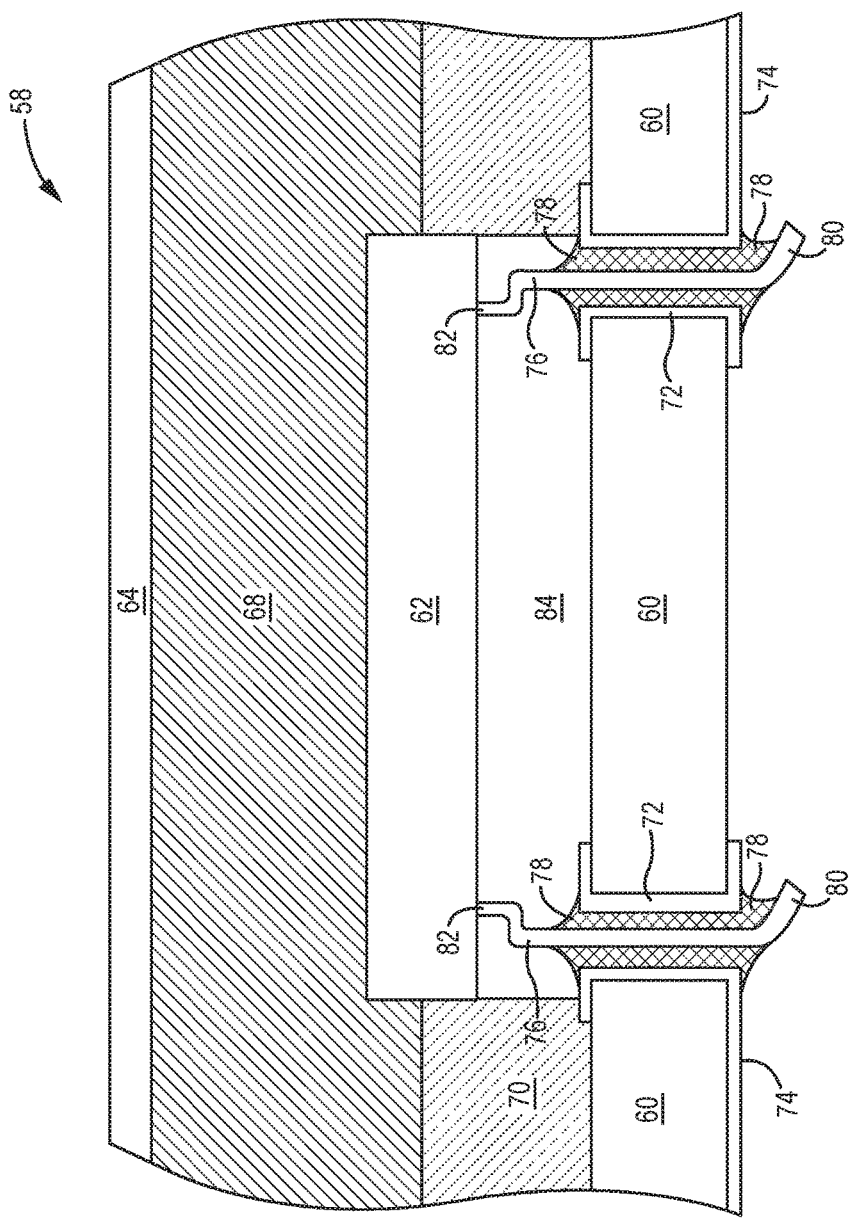
FIG. 16 is a cross-section of a portion of the electronics module, wherein a stress mitigation layer substantially surrounds the body of the electronic component, and wherein a top surface of the electronic component is not covered by the stress mitigation layer and a cavity is formed between a bottom surface of the electronic component and a top surface of the printed circuit board.

FIGS. 15 and 16 illustrate embodiments wherein an air or other gas-filled cavity 84 is provided between the bottom surface of the electronic component 62 and the top surface of the PCB 60. The stress mitigation layer 70 essentially forms the sidewalls that define the cavity 84, wherein the upper and lower bounds of the cavity 84 are formed by the bottom surface of the electronic component 62 and the top surface of PCB 60, respectively. In any single embodiment, certain electronic components 62 may be provided with a cavity 84 between the bottom surface of the electronic component 62 and the top surface of the PCB 60, while other electronic component 62 are under-filled with the material of the stress mitigation layer 70. In other words, some electronic component 62 may be associated with a cavity 84 while others may not. Cavities 84 are beneficial for those electronic components 62 that have bodies that are susceptible to being fractured by bottom forces, which occur due to the expansion of material that resides between the bottom surface of the electronic component 62 and the top surface of the PCB 60.

In select embodiments, the material for the stress mitigation layer 70 is selected and applied such that the material will not flow beneath any of the electronic components 62, or at least those electronic components 62 that are susceptible to bottom forces, during formation of the stress mitigation layer 70 and the potting layer 68. FIG. 15 illustrates an embodiment where the stress mitigation layer 70 covers the top surfaces of at least some of the electronic components 62. FIG. 16 illustrates an embodiment where the stress mitigation layer 70 does not cover the top surfaces of at least some electronic components 62. Either of these embodiments may be combined with lead forming and lead clinching techniques in an effort to provide populated PCBs 60, which are highly resistant to solder fractures due to the thermal expansion and contraction of the stress mitigation layer 70 and the potting layer 68.

The stress mitigation techniques described above alone, or in any combination, are particularly beneficial for electronic modules 58 that are subjected to cyclic temperature extremes. Residential, commercial, and industrial lighting applications are examples. Using the stress mitigation techniques and the driver module 28, the communications module 30, and the like greatly increases the integrity of these modules by preventing solder joint fractures, which are a direct result of the expansion and contraction of potting materials used to fill these modules. In certain embodiments, the driver module 28 is capable of withstanding more than 600 temperature cycles between at least −40 Celsius (C) and 105 C.

Those skilled in the art will recognize improvements and modifications to the embodiments of the present disclosure. All such improvements and modifications are considered within the scope of the concepts disclosed herein and the claims that follow.

What is claimed is:

1. A lighting fixture comprising:
a plurality of light emitting diodes (LEDs) responsive to a drive signal; and
a driver module configured to provide the drive signal and comprising:
a printed circuit board comprising a plurality of vias, which extend through the printed circuit board;
a plurality of electronic components that each comprise a body and a plurality of leads that extend from the body and through corresponding ones of the plurality of vias, wherein solder joints electrically and mechanically affix the plurality of leads within the corresponding ones of the plurality of vias;
a stress mitigation layer comprising a silicone gel and applied over a top surface of the printed circuit board; and
a potting layer applied over the stress mitigation layer and the plurality of electronic components, wherein an ASTM Shore hardness rating of the stress mitigation layer is less than an ASTM Shore hardness rating of the potting layer;
wherein the stress mitigation layer is between the potting layer and the solder joints.

2. The lighting fixture of claim 1 wherein the potting layer comprises silicone.

3. The lighting fixture of claim 2 wherein the ASTM Shore hardness rating of the stress mitigation layer is less than 70 on a Shore type 00 scale, and the ASTM Shore hardness rating of the potting layer is between 35 and 90 on a Shore type A scale.

4. The lighting fixture of claim 2 wherein the ASTM Shore hardness rating of the stress mitigation layer is less than 65 on a Shore type 00 scale, and the ASTM Shore hardness rating of the potting layer is between 40 and 85 on a Shore type A scale.

5. The lighting fixture of claim 2 wherein a modulus of elasticity of the stress mitigation layer is between 0.0005 and 0.003 mega-pascal (MPa), and a modulus of elasticity of the potting layer is between 1.0 and 5.0 MPa.

6. The lighting fixture of claim 2 wherein a modulus of elasticity of the stress mitigation layer is between 0.001 and 0.0015 mega-pascal (MPa), and a modulus of elasticity of the potting layer is between 1.0 and 5.0 MPa.

7. The lighting fixture of claim 2 wherein a thermal conductivity of the stress mitigation layer is less than 0.2 watts per meter kelvin (W/(m k), and a thermal conductivity of the potting layer is greater than 0.40 W/(m k).

8. The lighting fixture of claim 2 wherein:
at least two of the plurality of leads have clinched ends; and
the at least two of the plurality of leads are lead formed such that the at least two of the plurality of leads are formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the at least two of the plurality of leads prior to reaching the solder joints.

9. The lighting fixture of claim 2 wherein the ASTM Shore hardness rating of the stress mitigation layer is less than 65 on a Shore type 00 scale, and the ASTM Shore hardness rating of the potting layer is between 35 and 90 on a Shore type A scale.

10. The lighting fixture of claim 2 wherein at least two of the plurality of leads have clinched ends.

11. The lighting fixture of claim 2 wherein at least two of the plurality of leads are lead formed such that the at least two of the plurality of leads are formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the at least two of the plurality of leads prior to reaching the solder joints.

12. The lighting fixture of claim 2 wherein a cavity is formed beneath at least one of the plurality of electronic components, the cavity defined by a bottom surface of the at least one of the plurality of electronic components, the top surface of the printed circuit board, and at least one sidewall of the stress mitigation layer.

13. The lighting fixture of claim 2 wherein the stress mitigation layer completely covers top surfaces of at least certain of the plurality of electronic components.

14. The lighting fixture of claim 13 wherein a cavity is formed beneath at least one of the plurality of electronic components, the cavity defined by a bottom surface of the at least one of the plurality of electronic components, the top surface of the printed circuit board, and at least one sidewall of the stress mitigation layer.

15. The lighting fixture of claim 14 wherein:
the plurality of leads have clinched ends; and
the plurality of leads are lead formed such that each of the plurality of leads is formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the plurality of leads prior to reaching the solder joints.

16. The lighting fixture of claim 15 wherein the ASTM Shore hardness rating of the stress mitigation layer is less than 65 on a Shore type 00 scale, and the ASTM Shore hardness rating of the potting layer is between 40 and 85 on a Shore type A scale.

17. The lighting fixture of claim 2 wherein the stress mitigation layer does not cover top surfaces of any of the plurality of electronic components.

18. The lighting fixture of claim 16 wherein a cavity is formed beneath at least one of the plurality of electronic components, the cavity defined by a bottom surface of the at least one of the plurality of electronic components, the top surface of the printed circuit board, and at least one sidewall of the stress mitigation layer.

19. The lighting fixture of claim 17 wherein:
the plurality of leads have clinched ends; and
the plurality of leads are lead formed such that each of the plurality of leads is formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the plurality of leads prior to reaching the solder joints.

20. The lighting fixture of claim 19 wherein the ASTM Shore hardness rating of the stress mitigation layer is less than 65 on a Shore type 00 scale, and the ASTM Shore hardness rating of the potting layer is between 40 and 85 on a Shore type A scale.

21. The lighting fixture of claim 1 wherein the solder joints withstand fracturing after 600 temperature cycles between −40 Celsius and 105 Celsius.

22. The lighting fixture of claim 2 wherein a thermal conductivity of the potting layer is greater than a thermal conductivity of the stress mitigation layer.

23. The lighting fixture of claim 2 wherein
the ASTM Shore hardness rating of the stress mitigation layer is less than 65 on a Shore type 00 scale, and the ASTM Shore hardness rating of the potting layer is between 40 and 85 on a Shore type A scale; and
a thermal conductivity of the stress mitigation layer is less than 0.2 watts per meter kelvin (W/(m k), and a thermal conductivity of the potting layer is greater than 0.40 W/(m k).

24. An electronics module comprising:
a printed circuit board comprising a plurality of vias, which extend through the printed circuit board;
a plurality of electronic components that each comprise a body and a plurality of leads that extend from the body and through corresponding ones of the plurality of vias, wherein solder joints electrically and mechanically affix the plurality of leads within the corresponding ones of the plurality of vias;
a stress mitigation layer comprising a silicone gel and applied over a top surface of the printed circuit board; and
a potting layer applied over the stress mitigation layer and the plurality of electronic components, wherein an ASTM Shore hardness rating of the stress mitigation layer is less than an ASTM Shore hardness rating of the potting layer;
wherein the stress mitigation layer is between the potting layer and the solder joints.

25. The electronics module of claim 24 wherein the potting layer comprises silicone.

26. The electronics module of claim 25 wherein the ASTM Shore hardness rating of the stress mitigation layer is less than 70 on a Shore type 00 scale, and the ASTM Shore hardness rating of the potting layer is between 35 and 90 on a Shore type A scale.

27. The electronics module of claim 25 wherein the ASTM Shore hardness rating of the stress mitigation layer is less than 65 on a Shore type 00 scale, and the ASTM Shore hardness rating of the potting layer is between 40 and 85 on a Shore type A scale.

28. The electronics module of claim 25 wherein a modulus of elasticity of the stress mitigation layer is between 0.0005 and 0.003 mega-pascal (MPa), and a modulus of elasticity of the potting layer is between 1.0 and 5.0 MPa.

29. The electronics module of claim 25 wherein a modulus of elasticity of the stress mitigation layer is between 0.001 and 0.0015 mega-pascal (MPa), and a modulus of elasticity of the potting layer is between 1.0 and 5.0 MPa.

30. The electronics module of claim 25 wherein a thermal conductivity of the stress mitigation layer is less than 0.2 watts per meter kelvin (W/(m k), and a thermal conductivity of the potting layer is greater than 0.40 W/(m k).

31. The electronics module of claim 25 wherein:

at least two of the plurality of leads have clinched ends; and the at least two of the plurality of leads are lead formed such that the at least two of the plurality of leads are formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the at least two of the plurality of leads prior to reaching the solder joints.

32. The electronics module of claim 31 wherein a thermal conductivity of the potting layer is greater than a thermal conductivity of the stress mitigation layer.

33. The electronics module of claim 31 wherein the ASTM Shore hardness rating of the stress mitigation layer is less than 65 on a Shore type 00 scale, and the ASTM Shore hardness rating of the potting layer is between 40 and 85 on a Shore type A scale; and a thermal conductivity of the stress mitigation layer is less than 0.2 watts per meter kelvin (W/(m k), and a thermal conductivity of the potting layer is greater than 0.40 W/(m k).

34. The electronics module of claim 25 wherein at least two of the plurality of leads have clinched ends.

35. The electronics module of claim 25 wherein at least two of the plurality of leads are lead formed such that the at least two of the plurality of leads are formed into at least one non-linear shape between the top surface of the printed circuit board and bottom surfaces of the bodies of the plurality of electronic components, such that forces applied to the bodies of the plurality of electronic components due to expansion and contraction of the potting layer are absorbed by the at least two of the plurality of leads prior to reaching the solder joints.

* * * * *